US009571263B2

(12) United States Patent
Nallani et al.

(10) Patent No.: US 9,571,263 B2
(45) Date of Patent: Feb. 14, 2017

(54) INTEGRATED CIRCUIT INCORPORATING A LOW POWER DATA RETIMING CIRCUIT

(71) Applicant: Avago Technologies General IP (Singapore) Pte. Ltd., Singapore (SG)

(72) Inventors: Chakravartula Nallani, San Jose, CA (US); Samir Aboulhouda, Portola Valley, CA (US); Ramana Murty Malladi, Williston, VT (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/728,575

(22) Filed: Jun. 2, 2015

(65) Prior Publication Data

US 2016/0359611 A1   Dec. 8, 2016

(51) Int. Cl.
*H04L 7/00*     (2006.01)
*H04L 7/033*   (2006.01)
*H03L 7/08*    (2006.01)

(52) U.S. Cl.
CPC ............. *H04L 7/0045* (2013.01); *H03L 7/08* (2013.01); *H04L 7/0004* (2013.01); *H04L 7/0332* (2013.01)

(58) Field of Classification Search
CPC ............... H03L 7/00; H03L 7/06; H03L 7/08; H03L 7/0807; H03L 7/083; H03L 7/099; H03L 7/0991; H03L 7/16; H03L 7/20; H04L 7/00; H04L 7/0004; H04L 7/0045; H04L 7/033; H04L 7/0331; H04L 7/0332; H04L 7/04; H03K 19/0944; H03K 19/09448; H03K 19/0948; H03K 19/09485; H03K 19/096; H03K 19/0963

USPC ............... 375/326, 327, 371, 373, 375, 376; 326/93–98; 327/145–147, 155, 156; 713/400, 503

See application file for complete search history.

(56) References Cited

U.S. PATENT DOCUMENTS

| | | | | |
|---|---|---|---|---|
| 6,931,086 B2* | 8/2005 | Harrison | .............. | G11C 7/1072 375/374 |
| 7,728,637 B2 | 6/2010 | Choi | | |
| 2005/0111607 A1* | 5/2005 | Loke | .................... | H03D 13/004 375/376 |
| 2008/0238489 A1* | 10/2008 | Sanduleanu | ............ | H03L 7/087 327/42 |
| 2012/0062291 A1* | 3/2012 | Saitoh | ..................... | H04L 7/033 327/157 |
| 2012/0063556 A1* | 3/2012 | Hoang | .................... | H03L 7/087 375/371 |
| 2014/0132321 A1 | 5/2014 | Kesselring | | |

* cited by examiner

*Primary Examiner* — Young T Tse

(57) ABSTRACT

A low power data retiming circuit incorporates CMOS components in certain sections that operate at a lower frequency in comparison to certain other sections that use components based on bipolar technology for operating at a relatively higher frequency. The data retiming circuit includes a clock recovery circuit wherein a voltage controlled oscillator provides a recovered clock to a clock generator circuit for generating a latched clock that is provided to a phase detector and a data serializer. The data serializer operates as a synchronous multiplexer for generating a retimed data output signal from a pair of latched data input signals. The phase detector and the data serializer operate in a half-rate mode wherein high and low voltage levels of the latched clock are used for clocking data. The half-rate mode of operation permits the use of a clock frequency that is half that of an input data rate.

18 Claims, 5 Drawing Sheets

INTEGRATED CIRCUIT INCORPORATING A LOW POWER DATA RETIMING CIRCUIT

FIELD OF THE INVENTION

The invention relates to integrated circuits, and more particularly, to integrated circuits containing data retiming circuits.

BACKGROUND

Reducing the power consumption in electronic circuits is often an important aspect of circuit design, more so when such electronic circuits are incorporated into integrated circuits. Designers elect to reduce power consumption in various ways depending upon the nature of the electronic circuitry being designed. In some cases, a particular materials technology such as complementary metal oxide semiconductor (CMOS) technology can provide an advantage in terms of a lower level of power consumption in comparison to another material technology such as bipolar complementary metal oxide semiconductor (BiCMOS) technology. However, selecting CMOS technology over BiCMOS technology solely on the basis of reducing power consumption in an electronic circuit does not constitute a universal solution due to additional factors that should be taken into consideration in selecting the materials technology. For example, higher mask costs, poorer noise performance, and speed limitations of CMOS technology in comparison to BiCMOS technology, can render CMOS technology unsuitable for some types of high speed electronic circuits such as, for example, a data retiming circuit designed to operate at radio frequency (RF) rates. Consequently, in some cases, a designer may opt to forgo the use of CMOS technology and instead select a faster but more power-hungry technology such as BiCMOS in order to achieve satisfactory high speed circuit performance. While the use of a more power-hungry technology may be justified in some such cases, it may be unnecessary in some others where alternative solutions can exist.

Furthermore, in some cases, irrespective of the material that is selected, a circuit that is optimized solely on the basis of performance may include certain elements that incur unnecessary voltage drops that lead to a larger voltage overhead requirement upon the power supply. It is desirable that at least a part of this larger overhead be reduced or eliminated in order to provide a more power efficient solution.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure and not every similar element is shown in each figure, or replicated in the various figures. The drawings are not necessarily drawn to scale, emphasis instead being placed upon illustrating the principles of the invention. The drawings should not be interpreted as limiting the scope of the invention to the example embodiments shown herein.

WRITTEN DESCRIPTION

Figure 1:
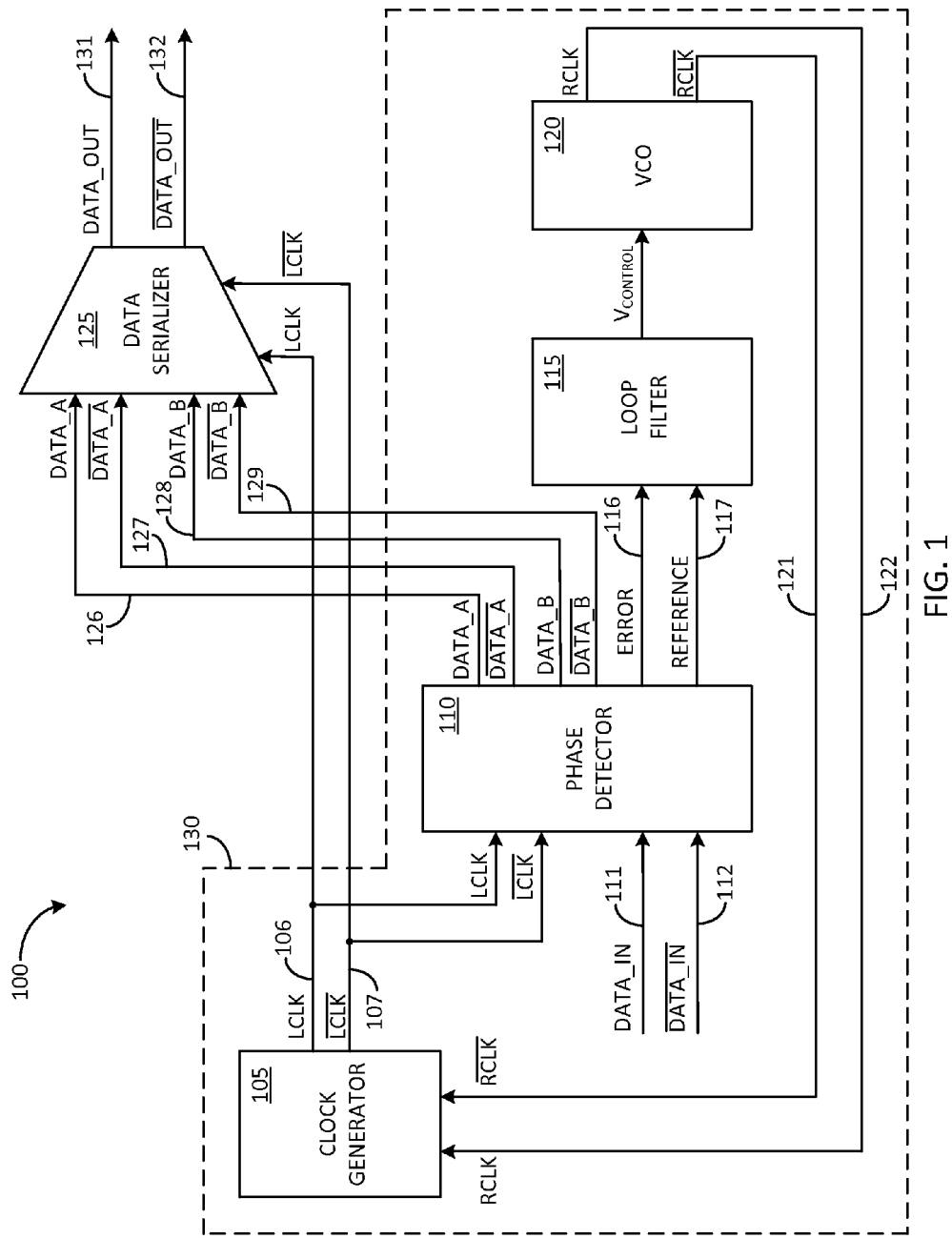
FIG. 1 shows an exemplary embodiment of a data retiming circuit that can be incorporated into an integrated circuit in accordance with the disclosure.

Throughout this description, embodiments and variations are described for the purpose of illustrating uses and implementations of inventive concepts. The illustrative description should be understood as presenting examples of inventive concepts, rather than as limiting the scope of the concept as disclosed herein. It should be further understood that certain words and phrases are used herein solely for convenience and such words and phrases should be interpreted as referring to various objects and actions that are generally understood in various forms and equivalencies by persons of ordinary skill in the art. For instance, it should be understood that the words "connected" or "coupled" generally refer to two elements that are connected to each other via a "line" wherein the word "line" indicates a connection medium such as for example a metal trace or a wire. The word "complementary" as used herein generally refers to a signal that is of opposite polarity to another signal carried on another line. This polarity relationship not only applies to single-ended signals but to differential signals as well. Thus, in the case of differential digital pulse signals, the polarity of a first digital pulse signal carried on one line of a first differential pair of lines is deemed to have a complementary relationship with a second digital pulse signal carried on a corresponding line of a second differential pair of lines when the second digital pulse signal has an opposite polarity to the first digital pulse signal. Furthermore, the word "example" as used herein is intended to be non-exclusionary and non-limiting in nature. More particularly, the word "exemplary" as used herein indicates one among several examples, and it must be understood that no undue emphasis or preference is being directed to the particular example being described. It should also be understood that the inventive concepts disclosed herein are not necessarily limited to a "device," and can be implemented in various other ways, such as for example, in the form of a circuit incorporating discrete components located on a printed circuit board (PCB).

In terms of a general overview, disclosed herein is an exemplary low power data retiming circuit that can be incorporated into an integrated circuit. The exemplary low power data retiming circuit is a hybrid circuit incorporating CMOS transistors as well as bipolar transistors. For example, some of the individual components of the low power data retiming circuit are CMOS transistors while others are bipolar transistors. The CMOS transistors are designed to operate at lower frequencies in comparison to certain bipolar transistors. More particularly, the CMOS transistors are incorporated into certain portions of the low power data retiming circuit that provide current references and current biasing, while the bipolar technology based components are incorporated into portions of the low power data retiming circuit that propagate data, clock and clock-related signals operating at higher frequencies. Various circuit elements of the low power data retiming circuit are also configured to include a fewer number of voltage drops between a power supply node and ground, thereby providing higher power efficiency.

The exemplary low power data retiming circuit also incorporates a phase locked loop circuit that includes a voltage controlled oscillator (VCO) to provide a recovered clock to a clock generator circuit for generating a latched clock. The latched clock generated by the clock generator circuit is not only used by a phase detector of the phase locked loop but also by a data serializer. The data serializer operates as a synchronous multiplexer that accepts a pair of latched data input signals and generates therefrom, a retimed data output signal. The phase detector and the data serializer operate in what is referred to herein as a half-rate mode of operation in which high and low voltage levels of the latched clock (rather than clock edges) are used for clocking data. The half-rate mode of operation permits the use of a clock frequency that is half that of the data rate. In one exemplary implementation, a clock rate anywhere in a 10 GHz to 15 GHz range can be used to operate on a data rate in a 20 GB/s to 30 Gb/s range correspondingly, in accordance with the disclosure.

Attention is now drawn to FIG. 1, which shows an exemplary embodiment of a data retiming circuit 100 that can be incorporated into an integrated circuit in accordance with the disclosure. The data retiming circuit 100, which can be alternatively referred to as a clocked data recovery (CDR) circuit, includes a clock recovery circuit 130 that is configured to operate in a phase locked loop mode of operation. The clock recovery circuit 130 incorporates a phase detector 110, a loop filter 115, a VCO 120, and a clock generator 105. The output of the clock generator 105 is coupled to the phase detector 110 as well as to a data serializer 125. The loop filter 115 and the VCO 120 can be implemented in a traditional manner as is known to persons of ordinary skill in the art. Consequently, the circuit configuration and operation of the loop filter 115 and the VCO 120 will not be elaborated upon herein so as to avoid obfuscation of certain aspects that are more directly pertinent to the disclosure.

The phase detector 110 provides an error signal and a reference signal that are applied to the loop filter 115 in order to generate a control voltage $V_{control}$ that is coupled into the VCO 120. The output of the VCO 120 is a recovered clock having a frequency that automatically varies in direct correspondence to variations in the control voltage. The recovered clock, which is provided in a differential signal format in this exemplary embodiment, is propagated via lines 121 and 122 to the clock generator 105 from the VCO 120.

The clock generator 105 uses the recovered clock to generate a latched clock in a manner that will be described below in more detail. The latched clock, which is also provided in a differential signal format in this exemplary embodiment, is propagated via lines 106 and 107 to the phase detector 110, as well as to the data serializer 125. The phase detector 110 applies the latched clock to a differential mode data input signal that is provided to the phase detector 110 via lines 111 and 112, and generates a pair of latched data input signals. The pair of latched data input signals is coupled to the data serializer 125 in a differential signal format via lines 126, 127, 128, and 129. The data serializer 125 operates as a synchronous multiplexer upon the pair of latched data input signals by using the latched clock (provided by the clock generator 105), to generate a retimed data output signal that is output in a differential signal format via lines 131 and 132.

Figure 2:
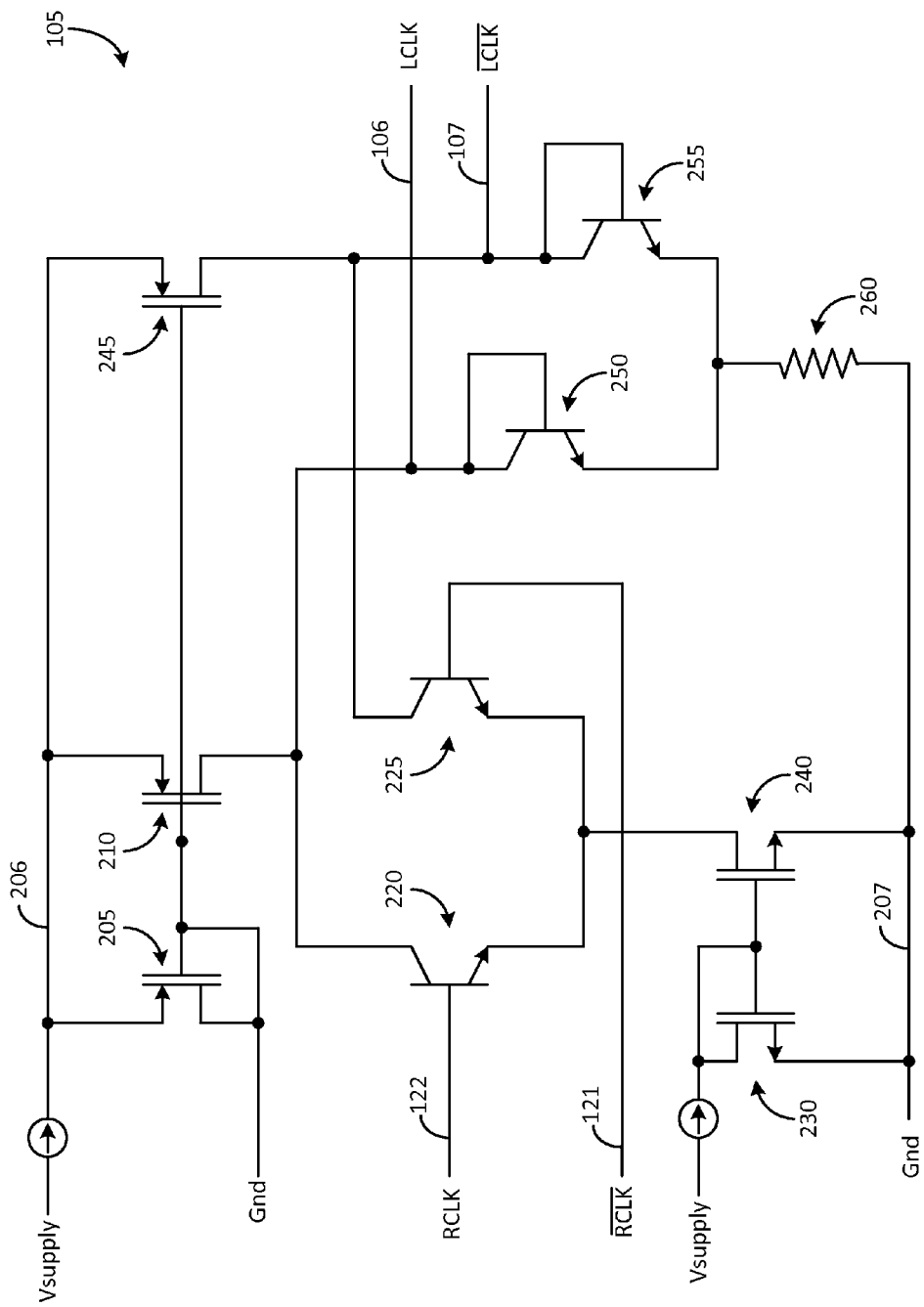
FIG. 2 shows an exemplary clock generator circuit that can be a part of the data retiming circuit shown in FIG. 1.

FIG. 2 shows an exemplary clock generator circuit 105 that can be a part of the data retiming circuit 100 shown in FIG. 1. The clock generator circuit 105 incorporates a folded circuit configuration in which the recovered clock that is provided by the VCO 120 via the lines 121 and 122 are applied to a first differential pair of bipolar transistors 220 and 225. The differential output of the bipolar transistors 220 and 225, which is generated at the collector terminals of the bipolar transistors 220 and 225, is coupled into a second differential pair of bipolar transistors 250 and 255. The second differential pair of bipolar transistors 250 and 255 operates in conjunction with the first differential pair of bipolar transistors 220 and 225 as a folded circuit for generating a latched clock output that is provided in a differential format on lines 106 and 107. Specifically, the transistor 250 provides a latching action by preventing a collector terminal of the transistor 220 from being placed in an indeterminate voltage condition. Specifically, the transistor 250 ensures that the collector terminal of the transistor 220 is pulled high when the recovered clock that is provided on line 122 places the transistor 220 in a non-conducting state and further ensures that the collector terminal of the transistor 220 is pulled low when the recovered clock that is provided on line 122 places the transistor 220 in a conducting state. In a similar fashion, the transistor 255 provides a latching action by preventing a collector terminal of the transistor 225 from being placed in an indeterminate voltage condition.

The transistors 230 and 240 operate as a current mirror circuit that enables current flow through one of the bipolar transistors 220 and 225, whenever a respective base terminal of the bipolar transistors 220 and 225 is raised to a high level by the recovered clock provided via lines 122 and 121. In contrast to the transistors 220, 225, 250 and 255, each of which is a bipolar transistor selected to provide for high speed clock operation, the transistors 205, 210, 245, 230, and 240 are CMOS elements that are adequate to operate as un-switched current sourcing elements. The combination of bi-polar and CMOS technologies provides for minimizing power consumption in the clock generator 105. In one example implementation, each of the transistors 205, 210, 245, 230, and 240 are BiCMOS elements that are amenable for fabrication on an integrated circuit in combination with NPN bipolar transistors such as the transistors 220, 225, 250 and 255.

The cumulative voltage drop between a supply node 206 and a ground node 207 is also minimized in comparison to various similar traditional circuits. The cumulative voltage drop includes for example, a first voltage drop across the source-drain terminals of transistor 210 (or transistor 245), a second voltage drop across the collector-emitter terminals of transistor 220 (or transistor 255), and a third voltage drop across the source-drain terminals of transistor 240 (or across the resistor 260).

Attention is now drawn to resistor 260, which is selected on the basis of providing high speed clock operation in bipolar transistors 250 and 255 and also to set an output impedance value that can be matched by a terminating resistor in the phase detector 110 and the data serializer 125 to which the clock generator 105 is coupled. In one example implementation, the resistor 260 is selected to be about 85 ohms. The terminating resistor aspect will be described below with reference to other figures pertaining to the phase detector 110 and the data serializer 125.

Figure 3:
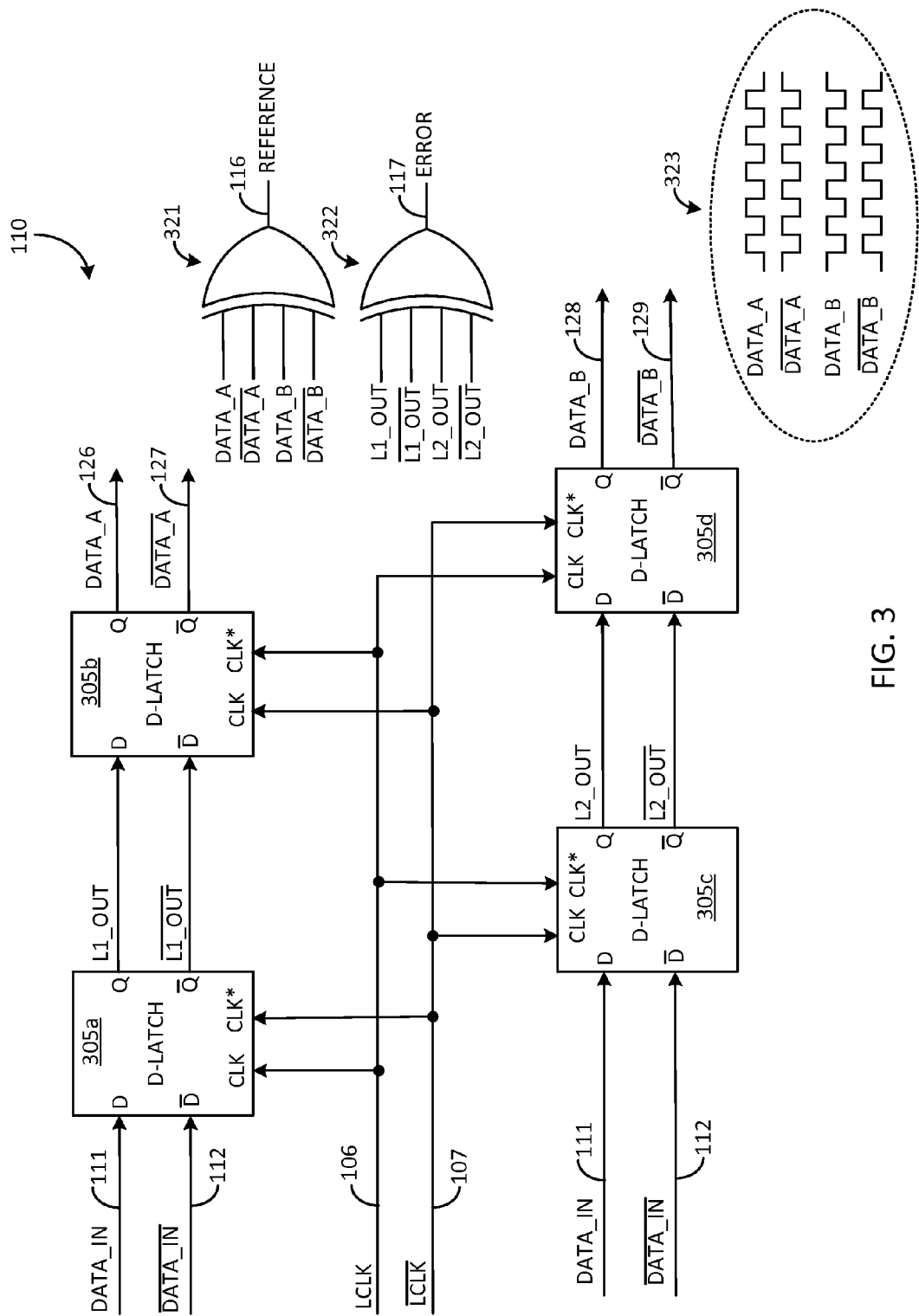
FIG. 3 shows an exemplary phase detector that can be a part of the data retiming circuit shown in FIG. 1.

FIG. 3 shows an exemplary phase detector 110 that can be a part of the data retiming circuit 100 shown in FIG. 1. The phase detector 110 includes a first pair of D-latches 305a and 305b that are connected in a first cascaded arrangement, and a second pair of D-latches 305c and 305d that are connected in a second cascaded arrangement. The latched clock output (LCLK) of the clock generator 105 is provided via the line 106 to the CLK input of each of the D-latch 305a and the D-latch 305d, and to the CLK* input of each of the D-latch 305b and the D-latch 305c. The complementary latched clock output ($\overline{\text{LCLK}}$) of the clock generator 105 is provided via the line 107 to the CLK input of each of the D-latch 305b and the D-latch 305c, and to the CLK* input of each of the D-latch 305a and the D-latch 305d.

A differential data input signal (DATA_IN and $\overline{\text{DATA\_IN}}$) that is provided via lines 111 and 112 to each of the D-latch 305a and the D-latch 305c is clocked through the four D-latches to produce a first differential latched data output signal (DATA_A and $\overline{\text{DATA\_A}}$) on lines 126 and 127 and a second differential latched data output signal (DATA_B and $\overline{\text{DATA\_B}}$) on lines 128 and 129. The first and the second pair of differential latched data output signals, which are complementary to each other, are coupled into the data serializer 125 as shown in FIG. 1. The complementary relationship between the first and the second pairs of differential latched data output signals (as indicated by the waveforms shown in the block 323), is produced as a result of the latched clock on line 106 (LCLK) and the complementary latched clock output ($\overline{\text{LCLK}}$) on line 107 being coupled into the four D-latches in the manner described above.

A first EXOR gate 321 is provided with the differential data output signals (DATA_A, $\overline{\text{DATA\_A}}$, DATA_B and $\overline{\text{DATA\_B}}$) from the D-latch 305b and the D-latch 305d for generating a reference signal that is output on line 116. A second EXOR gate 322 is provided with the differential data output signals (L1_OUT, $\overline{\text{L1\_OUT}}$, L2_OUT, and $\overline{\text{L2\_OUT}}$) from the D-latch 305a and the D-latch 305c for generating an error signal that is output on line 117. The error signal and the reference signal are coupled into the loop filter 115 as shown in FIG. 1.

Figure 4:
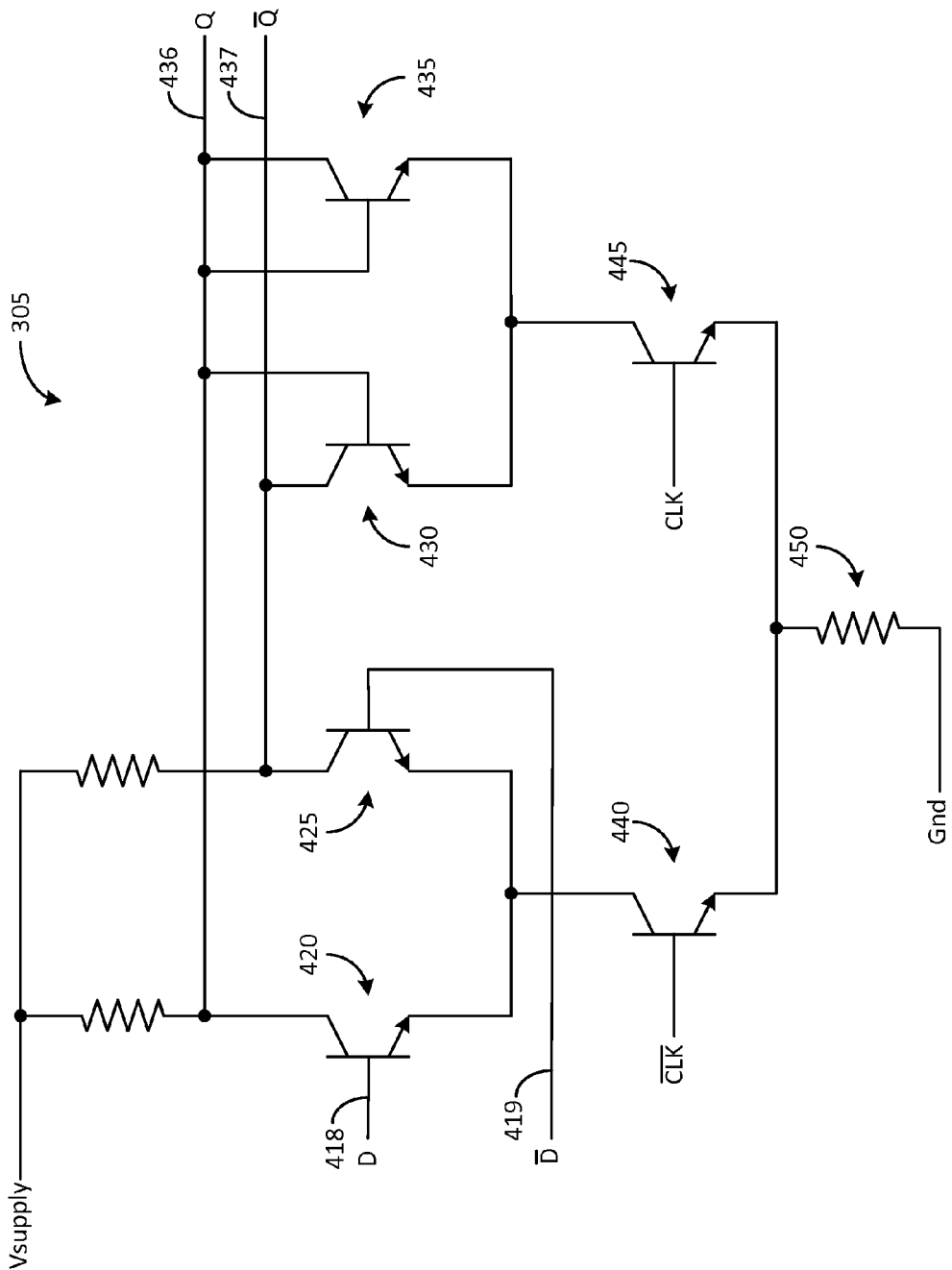
FIG. 4 shows an exemplary D-latch circuit that can be a part of the phase detector shown in FIG. 3.

Each of the D-latches 305a-d can be implemented using an example D-latch circuit 305 that is shown in FIG. 4. The D-latch circuit 305 shown in FIG. 4 includes a first differential pair of bipolar transistors 420 and 425 that is driven by a $\overline{\text{CLK}}$ signal provided to the transistor 440 that is coupled to the emitters of the bipolar transistors 420 and 425. The D-latch circuit 305 further includes a second differential pair of bipolar transistors 430 and 435 that is driven by a CLK signal provided to the transistor 445 that is coupled to the emitters of the bipolar transistors 430 and 435. As a result of the CLK and $\overline{\text{CLK}}$ signals being applied in this way, only one of the two differential pair of transistors is active at any given instant in time, thereby providing for a half-rate mode of operation of the D-latch 305.

For example, when the $\overline{\text{CLK}}$ signal is at a high voltage level, the first differential pair of bipolar transistors 420 and 425 is placed in an active state and therefore propagates to the Q and $\overline{\text{Q}}$ outputs, the D and $\overline{\text{D}}$ signals that are provided to the bipolar transistors 420 and 425, respectively, via lines 418 and 419, respectively. Furthermore, it can be understood that when the $\overline{\text{CLK}}$ signal is at a high voltage level, the CLK signal driving transistor 445 is at a corresponding low voltage level, whereby the differential pair of bipolar transistors 430 and 435 is placed in an inactive state. During the inactive state, the differential pair of bipolar transistors 430 and 435 operates as a hold circuit that holds the voltage conditions on the collectors of each of the transistors 420 and 425 of the first differential pair.

The active and inactive states of the two pairs of differential transistors is reversed when the $\overline{\text{CLK}}$ signal transitions from the high voltage level referred to above to a low voltage level. Attention is drawn to the resistor 450, which operates as a terminating resistor and can therefore be selected to match the resistor 260 that is a part of the clock generator 105. In the example implementation where the resistor 260 in the clock generator 105 is set at around 85 ohms, the resistor 450 can be set to a correspondingly similar value of around 85 ohms.

Figure 5:
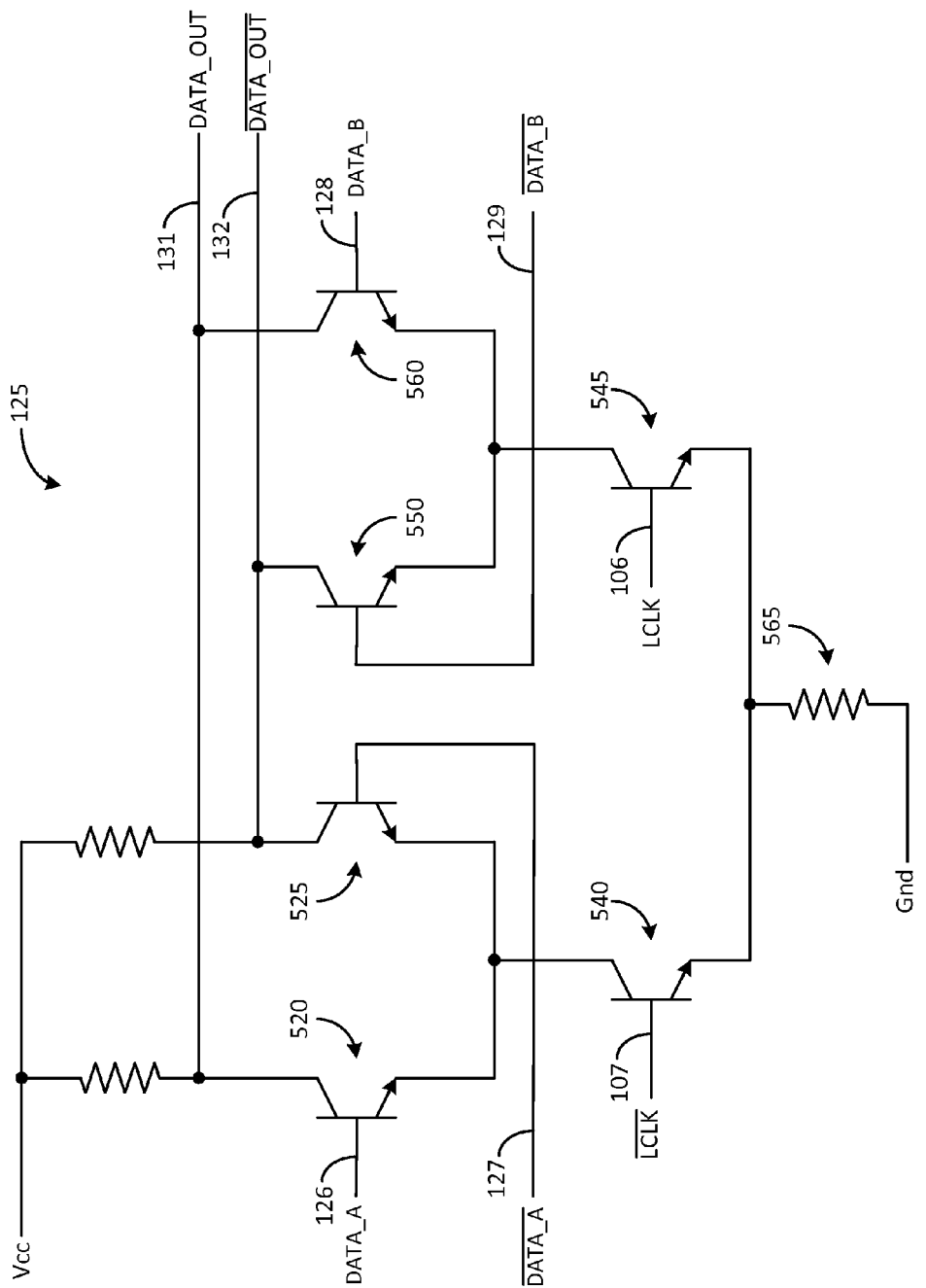
FIG. 5 shows an exemplary data serializer that can be a part of the data retiming circuit shown in FIG. 1.

FIG. 5 shows an exemplary data serializer 125 that can be a part of the data retiming circuit 100 shown in FIG. 1. The data serializer 125 operates as a multiplexer circuit for multiplexing two input signals. The first input signal is the first differential latched data output signal (DATA_A and $\overline{\text{DATA\_A}}$) provided by the phase detector 110 on lines 126 and 127 and the second input signal is the second differential latched data output signal (DATA_B and $\overline{\text{DATA\_B}}$) provided by the phase detector 110 on lines 128 and 129. As described above with respect to the phase detector 110, the second differential latched data output signal is a complementary version of the first differential latched data output signal.

The multiplexing operation is effectuated by the voltage levels of a latched clock ($\overline{\text{LCLK}}$) that is coupled into a base terminal of the transistor 540 and the complementary voltage levels of a complementary latched clock (LCLK) that is coupled into a base terminal of the transistor 545. Each of the latched clock and the complementary latched clock is provided to the data serializer 125 by the clock generator 105 (as shown in FIG. 1).

Whenever the latched clock ($\overline{\text{LCLK}}$) that is coupled into the base terminal of the transistor 540 is at a high voltage level, the complementary latched clock (LCLK) coupled into the base terminal of the transistor 545 is at a low voltage level, thereby enabling a first pair of transistors 520 and 525 and disabling a second pair of transistors 550 and 560, and vice-versa. When the first pair of transistors 520 and 525 is enabled, transitions of the latched data input signal (DATA_A and $\overline{\text{DATA\_A}}$) present on input lines 126 and 127 are propagated out in the form of the retimed data output signal (DATA_OUT and $\overline{\text{DATA\_OUT}}$) on lines 131 and 132. On the other hand, when the second pair of transistors 550 and 560 is enabled, transitions of the latched data input signal (DATA_B and $\overline{\text{DATA\_B}}$) present on input lines 128 and 129 are propagated out in the form of the retimed data output signal (DATA_OUT and $\overline{\text{DATA\_OUT}}$) on the lines 131 and 132.

Attention is drawn to the resistor 565, which operates as a terminating resistor and can therefore be selected to match the resistor 260 that is a part of the clock generator 105. In the example implementation where the resistor 260 in the clock generator 105 is set to a value of around 85 ohms, the resistor 565 can be set to a correspondingly similar value of around 85 ohms.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A data retiming circuit comprising:
   a voltage controlled oscillator;
   a clock generator configured to receive a recovered clock from the voltage controlled oscillator and generate therefrom, a latched clock; and
   a phase detector configured to receive the latched clock from the clock generator and to use two different voltage levels of the latched clock to generate from an input data signal provided to the phase detector, a first data output signal and a second data output signal, wherein each of the first data output signal, the second data output signal, and the latched clock is propagated in a differential signal format, and further wherein the clock generator comprises a first pair of transistors arranged in a first differential configuration, the first pair of transistors coupled to a second pair of transistors arranged in a second differential configuration, the second pair of transistors configured to operate as a latching circuit for latching output signals of the first pair of transistors.

2. The data retiming circuit of claim 1, further comprising:
a data serializer configured to receive the first data output signal and the second data output signal from the phase detector and to use the latched clock received from the clock generator to generate a serial data output.

3. The data retiming circuit of claim 2, wherein the data serializer is configured to operate in a half-rate mode using a third pair of transistors arranged in a third differential configuration and a fourth pair of transistors arranged in a fourth differential configuration, the half-rate mode characterized by the third pair of transistors conducting on a basis of a first voltage level of the latched clock and the fourth pair of transistors conducting on a basis of a second voltage level of the latched clock.

4. The data retiming circuit of claim 3, wherein the phase detector comprises a first pair of D-latches each provided with the latched clock from the clock generator for clocking the input data signal on the basis of the first and the second voltage levels of the latched clock and generating therefrom, a first differential data signal output.

5. The data retiming circuit of claim 4, wherein each of the first pair of D-latches comprises a fifth pair of transistors arranged in a fifth differential configuration and a sixth pair of transistors arranged in a sixth differential configuration, the fifth pair of transistors enabled on the basis of the first voltage level in the latched clock and the sixth pair of transistors enabled on the basis of the second voltage level in the latched clock.

6. The data retiming circuit of claim 5, wherein the sixth pair of transistors is configured to operate as a latching circuit for latching a differential output of the fifth pair of transistors.

7. The data retiming circuit of claim 4, wherein the phase detector further comprises a second pair of D-latches each provided with the latched clock from the clock generator for clocking the input data signal on the basis of the first and the second voltage levels of the latched clock and generating therefrom, a second differential data signal output that is complementary to the first differential data signal output generated by the first pair of D-latches.

8. A data retiming circuit comprising:
a phase detector comprising a first D-latch, the first D-latch configured to operate in a half-rate mode wherein a first differential configuration of transistors is enabled on the basis of a first voltage level of a first clock while a second differential configuration of transistors that is coupled in a latching arrangement with the first differential configuration of transistors is disabled on the basis of the first voltage level of the first clock, and further wherein the first differential configuration of transistors is disabled on the basis of a second voltage level of the first clock while the second differential configuration of transistors is enabled on the basis of the second voltage level of the first clock.

9. The data retiming circuit of claim 8, wherein the first clock is a differential latched clock, and further comprising:
a voltage controlled oscillator; and
a clock generator configured to receive a recovered clock from the voltage controlled oscillator and generate therefrom, the differential latched clock that is provided to the first D-latch in the phase detector.

10. The data retiming circuit of claim 9, wherein the phase detector further comprises a second D-latch, the second D-latch configured to receive the differential latched clock in a first clock connection arrangement that is complementary to a second clock connection arrangement associated with the first D-latch.

11. The data retiming circuit of claim 10, further comprising:
a data serializer coupled to the clock generator and the phase detector, the data serializer configured to receive two latched data signals from the phase detector, and to operate in a half-rate mode for generating a serial data output on the basis of two voltage levels of the differential latched clock.

12. The data retiming circuit of claim 11, wherein the two latched data signals are propagated in a differential signal format with complementary voltage levels.

13. The data retiming circuit of claim 12, wherein a first of the two latched data signals constitutes the serial data output of the data serializer when the differential latched clock has a first voltage polarity and a second of the two latched data signals constitutes the serial data output of the data serializer when the differential latched clock has an opposite voltage polarity of the first voltage polarity.

14. A data retiming circuit comprising:
a voltage controlled oscillator;
a clock generator configured to receive a recovered clock from the voltage controlled oscillator and generate therefrom, a latched clock;
a phase detector configured to receive the latched clock from the clock generator and to use two different voltage levels of the latched clock to generate from an input data signal provided to the phase detector, a first data output signal and a second data output signal; and
a data serializer configured to receive the first data output signal and the second data output signal from the phase detector and to use the latched clock received from the clock generator to generate a serial data output, wherein the data serializer is configured to operate in a half-rate mode using a first pair of transistors arranged in a first differential configuration and a second pair of transistors arranged in a second differential configuration, the half-rate mode characterized by the first pair of transistors conducting on a basis of a first voltage level of the latched clock and the second pair of transistors conducting on a basis of a second voltage level of the latched clock.

15. The data retiming circuit of claim 14, wherein the phase detector comprises a first pair of D-latches each provided with the latched clock from the clock generator for clocking the input data signal on the basis of the first and the second voltage levels of the latched clock and generating therefrom, a first differential data signal output.

16. The data retiming circuit of claim 15, wherein each of the first pair of D-latches comprises a third pair of transistors arranged in a third differential configuration and a fourth pair of transistors arranged in a fourth differential configuration, the third pair of transistors enabled on the basis of the first voltage level in the latched clock and the fourth pair of transistors enabled on the basis of the second voltage level in the latched clock.

17. The data retiming circuit of claim 16, wherein the fourth pair of transistors is configured to operate as a latching circuit for latching a differential output of the third pair of transistors.

18. The data retiming circuit of claim 15, wherein the phase detector further comprises a second pair of D-latches each provided with the latched clock from the clock generator for clocking the input data signal on the basis of the first and the second voltage levels of the latched clock and generating therefrom, a second differential data signal output that is complementary to the first differential data signal output generated by the first pair of D-latches.

* * * * *